| (12) | United States Patent<br>Lee et al. | (10) Patent No.: US 11,754,440 B2<br>(45) Date of Patent: Sep. 12, 2023 |
|---|---|---|

(54) OPTO-MECHANICAL STRUCTURE DESIGN OF THIN LGA PACKAGE WITH GLASS COVER AND A THICKNESS OF AN APERTURE CEILING IS 0.20MM

(71) Applicant: PixArt Imaging Inc., Hsin-Chu (TW)

(72) Inventors: Sai Mun Lee, Penang (MY); Chee Pin T'ng, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 53 days.

(21) Appl. No.: 17/571,554

(22) Filed: Jan. 10, 2022

(65) Prior Publication Data

US 2023/0221174 A1 Jul. 13, 2023

(51) Int. Cl.
*H01L 31/02* (2006.01)
*G01J 1/04* (2006.01)
*H05K 1/18* (2006.01)

(52) U.S. Cl.
CPC ............ *G01J 1/0407* (2013.01); *H05K 1/183* (2013.01); *H05K 2201/10106* (2013.01); *H05K 2201/10151* (2013.01); *H05K 2201/10719* (2013.01)

(58) Field of Classification Search
CPC ....... H01L 27/146; H01L 31/02; H04N 23/50; H04N 23/57; H05K 1/18; H05K 1/02
USPC .................................................. 250/239, 221
See application file for complete search history.

(56) References Cited

U.S. PATENT DOCUMENTS 11,583,200 B2 * 2/2023 Han ..................... A61B 5/0261

* cited by examiner

*Primary Examiner* — Que Tan Le
(74) *Attorney, Agent, or Firm* — Winston Hsu

(57) ABSTRACT

The invention provides an optical sensor package. The optical sensor package includes: a printed circuit board (PCB); a sensor disposed on the PCB; a glass cover disposed directly on the sensor; and an aperture disposed on the PCB comprised of a solid perimeter surrounding the sensor and a ceiling having a cut-out section above the glass cover. The cut-out section of the ceiling is smaller in area than the glass cover. The part of the aperture ceiling which overhangs the glass cover is thicker than the remaining part. The optical sensor package further includes an LED die disposed on the PCB, and Kapton tape placed over the ceiling of the aperture.

7 Claims, 8 Drawing Sheets

OPTO-MECHANICAL STRUCTURE DESIGN OF THIN LGA PACKAGE WITH GLASS COVER AND A THICKNESS OF AN APERTURE CEILING IS 0.20MM

BACKGROUND OF THE INVENTION

1. Field of the Invention

This invention is directed to optical sensor packages, and more particularly, to a Land Grid Array (LGA) package with a glass cover placed directly on a sensor active surface so that the distance between the sensor active surface and the top of the optical sensor package is reduced.

2. Description of the Prior Art

Standard optical sensor packages comprise a substrate with an optical sensor and at least an LED formed thereon, with an opaque enclosure mounted on the substrate and formed around the optical sensor and LED. The LED emits light to a surface/object which is then reflected back and detected by the optical sensor. Conductive elements such as wires are disposed within the optical sensor package for carrying signals from the optical sensor to a processing device. The opaque enclosure is designed to allow light to be emitted from certain angles, while blocking light from unwanted sources.

Refer to FIG. 1A which illustrates a related art optical sensor package 100. The optical sensor package 100 comprises a printed circuit board (PCB) 110, and an LED die 130 and a sensor die 120 are both placed on the PCB 110. An aperture 140 is formed around both dies. As shown in the diagram, the aperture 140 is indented at the top to form a pocket. A glass cover 150 sits in this pocket, and is used to protect the sensor die 120 and LED die 130 from dust and dirt, while still allowing light from the LED die 130 to be emitted and allowing reflected light to be transmitted to the sensor die 129. Finally, Kapton tape 160 is placed over the top of the aperture 140, to act as an insulator and protection layer.

The aperture 140 needs to have particular dimensions in order for the optical sensor package 100 to function correctly. Wire looping (not shown) for transmitting signals from the sensor die 120 requires 0.15 mm minimum clearance and the aperture 140 has a notched shape at the bottom to accommodate this. The height of the aperture 140 from the top of the wire looping to the pocket should have a minimum thickness of 0.30 mm; this provides enough resistance to any external force that will prevent the aperture 140 from pressing down on the wires. The pocket of the aperture 140 (from the bottom of the glass cover 150 to the bottom of the Kapton tape 160) has a height of 0.21 mm, which is to accommodate the glass cover 150 which has a height of 0.10 mm. This is further to allow enough clearance between the top of the glass cover 150 and the bottom of the Kapton tape 160 to prevent any residue or contamination from the Kapton tape 160 being left on the glass cover 150.

FIG. 1B illustrates the manufacturing stages of the optical sensor package 100. The bottom of the diagram illustrates the PCB 110, with the sensor die 120 and LED die 130 formed thereon. The middle of the diagram shows the aperture 140, including the indented pocket and the dividing region between the sensor die 120 and LED die 130. The aperture 140 is directly placed on the PCB 110. The top of the diagram shows the glass cover 150, which will be placed in the indented pocket to cover the sensor die 120 and LED die 130. Kapton tape 160 (not shown in FIG. 1B) will then be formed over the top of the optical sensor package 100 for protecting and insulating the entire structure.

The dimensions shown in FIG. 1A are the minimum values for the optical sensor package 100 to function correctly. As the trend for electronic devices is to be smaller and more portable, it is desirable for dimensions of optical sensor packages to also be reduced.

SUMMARY OF THE INVENTION

The invention provides an optical sensor package. The optical sensor package comprises: a printed circuit board (PCB); a sensor disposed on the PCB; a glass cover disposed directly on the sensor; and an aperture disposed on the PCB comprised of a solid perimeter surrounding the sensor and a ceiling having a cut-out section above the glass cover. The cut-out section of the ceiling is smaller in area than the glass cover. The part of the aperture ceiling which overhangs the glass cover is thicker than the remaining part. The optical sensor package further comprises an LED die disposed on the PCB, and Kapton tape placed over the ceiling of the aperture.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a new optical sensor package structure which can reduce the package thickness. This is achieved by designing an aperture having a different structure from that of the related art, and placing the glass cover directly over the sensor die.

Figure 1A:
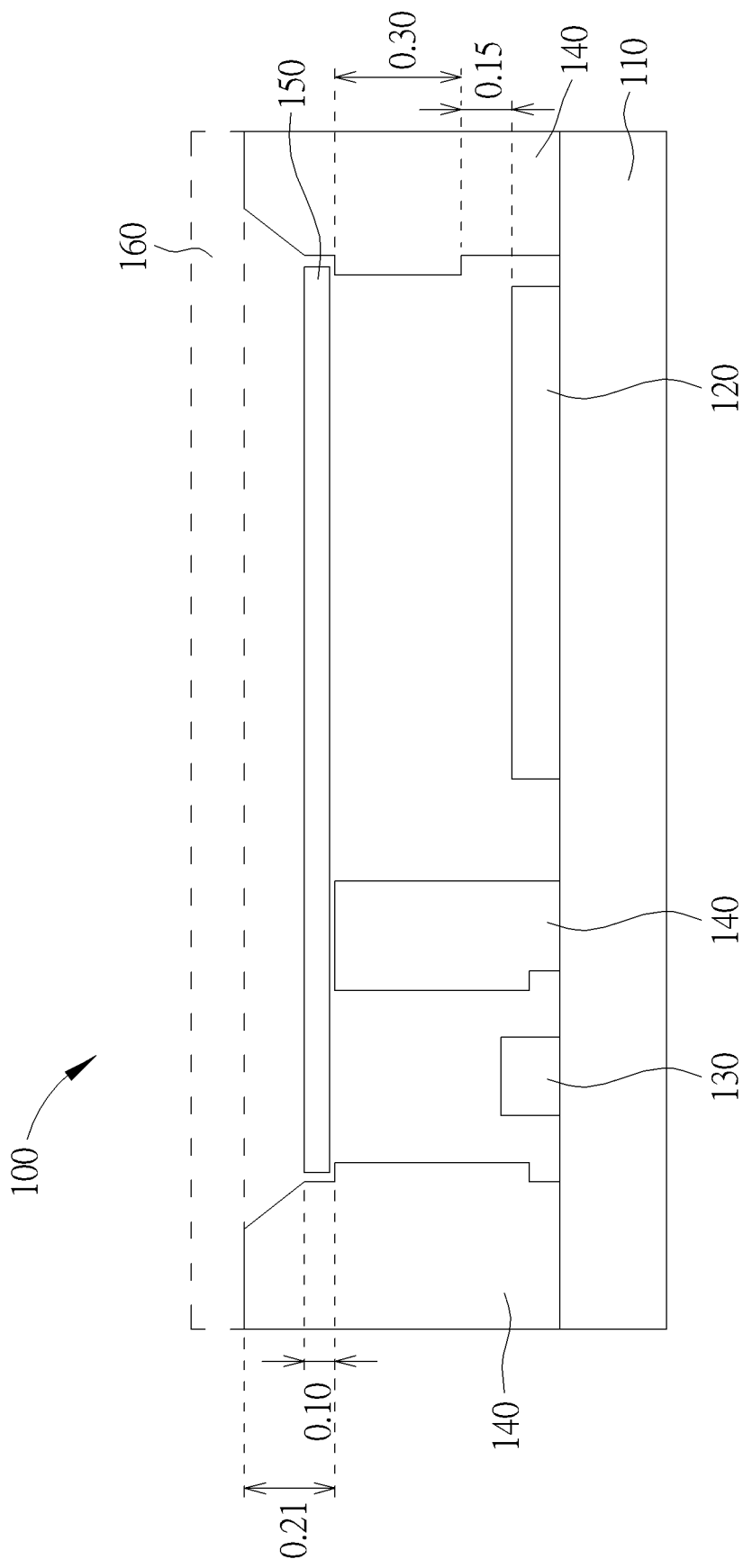
FIG. 1A is a related art diagram of an optical sensor package.
Figure 1B:
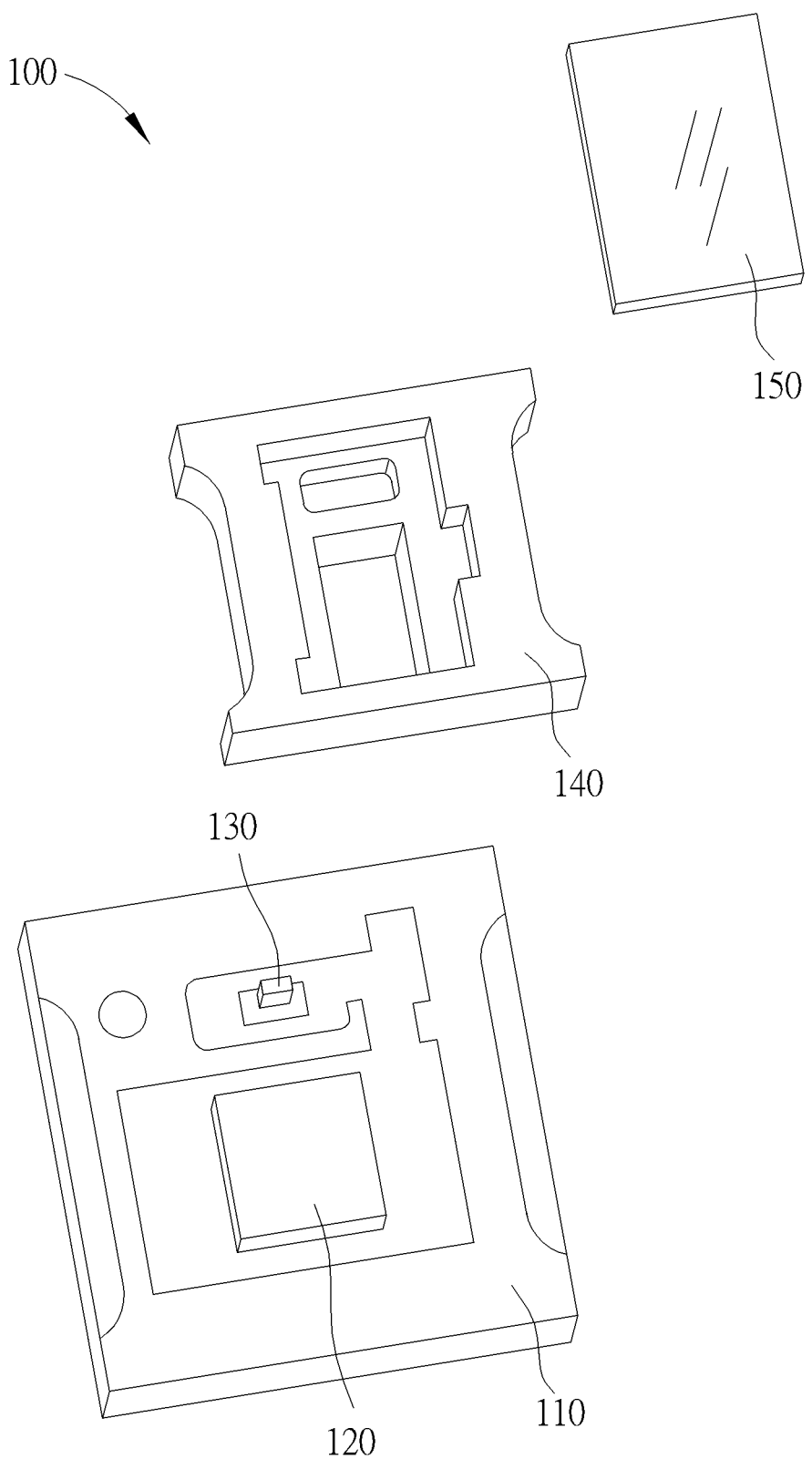
FIG. 1B is a diagram of the manufacturing stages of the optical sensor package shown in FIG. 1A.
Figure 2:
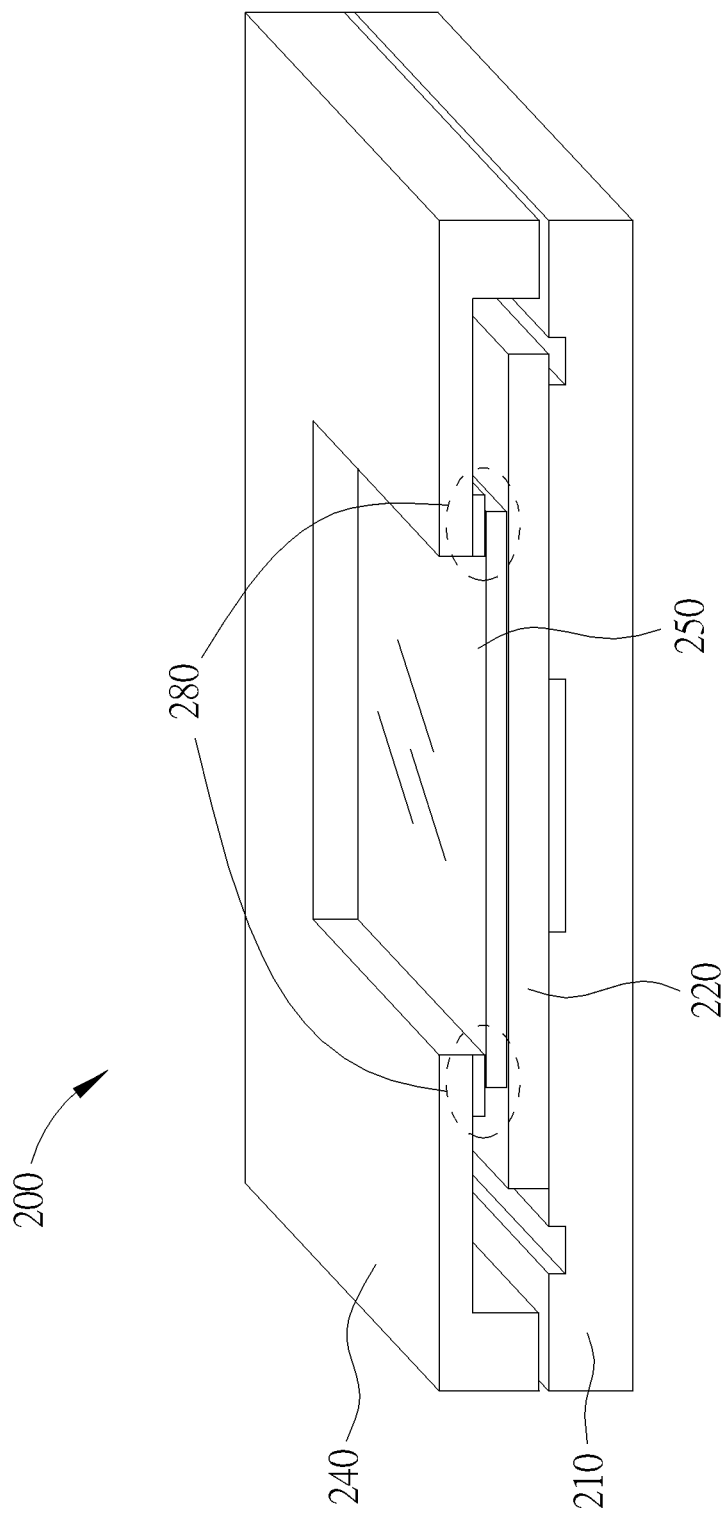
FIG. 2 is a diagram of an optical sensor package according to an embodiment of the present invention.

Refer to FIG. 2, which is a diagram of an optical sensor package 200 according to an embodiment of the present invention. The optical sensor package 200 is formed of a PCB 210, having a sensor die 220 placed thereon. A glass cover 250 is placed directly over the sensor die 220. The aperture 240 is placed on the PCB 210, wherein the aperture has four opaque walls and a roof with a cut-out section corresponding to the glass cover 250. This cut-out section is slightly smaller than the glass cover 250. In addition, parts of the aperture roof which contact the glass cover 250

(indicated by the dashed lines and the numeral 280) are slightly thicker than the remaining part of the roof.

Figure 3A:
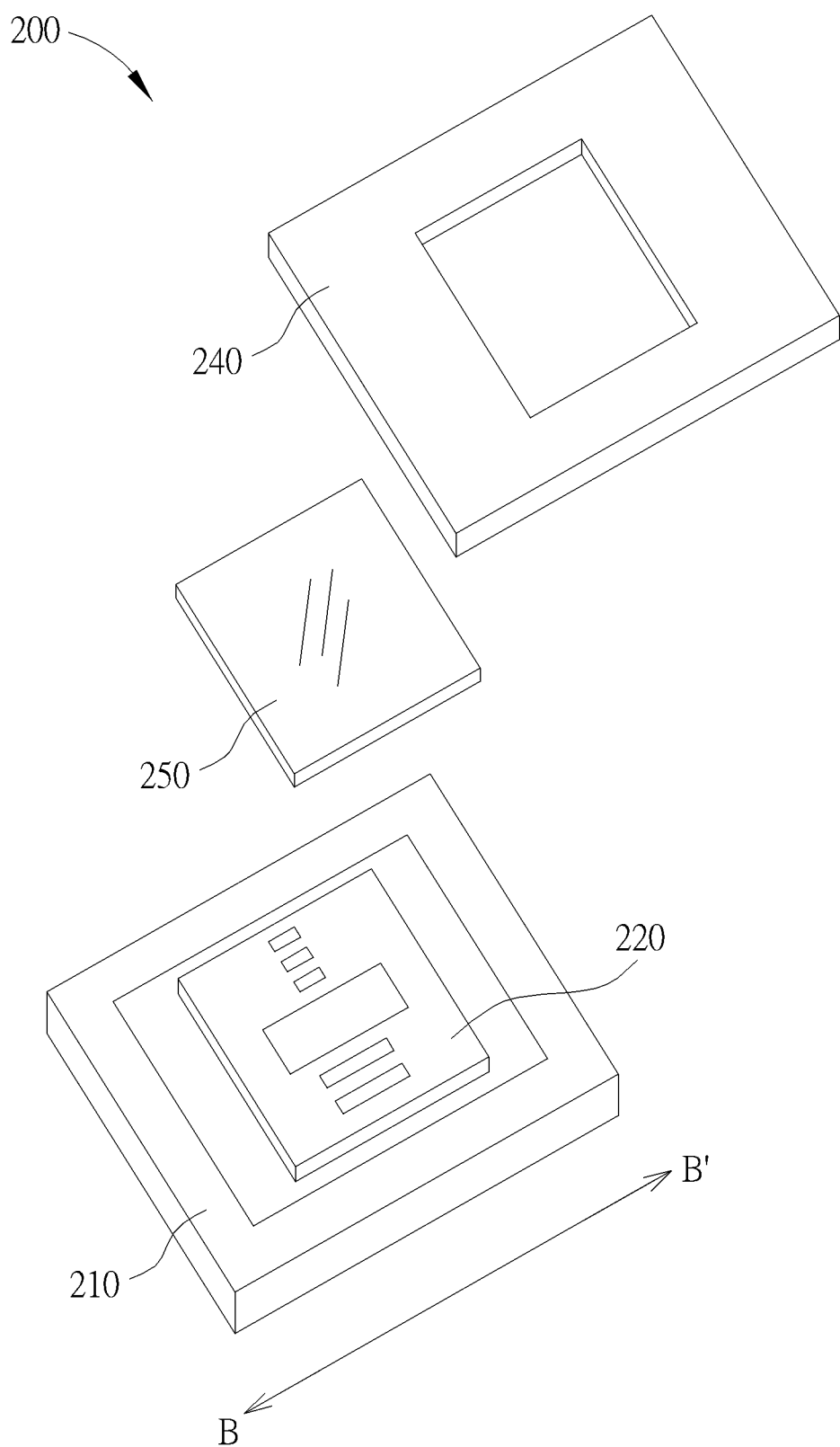
FIG. 3A is a diagram of the manufacturing stages of the optical sensor package according to an embodiment of the present invention.

Refer to FIG. 3A which is a diagram of the manufacturing stages of the optical sensor package 200 according to an embodiment of the present invention. As shown in the bottom of the diagram, the PCB 210 has a sensor die 220 formed thereon. Next, the glass cover 250 will be directly placed on the sensor die 220. Finally, as shown in the top of the diagram, the aperture 240 having a cut-out section in the roof will be placed on the PCB 210.

Figure 3B:
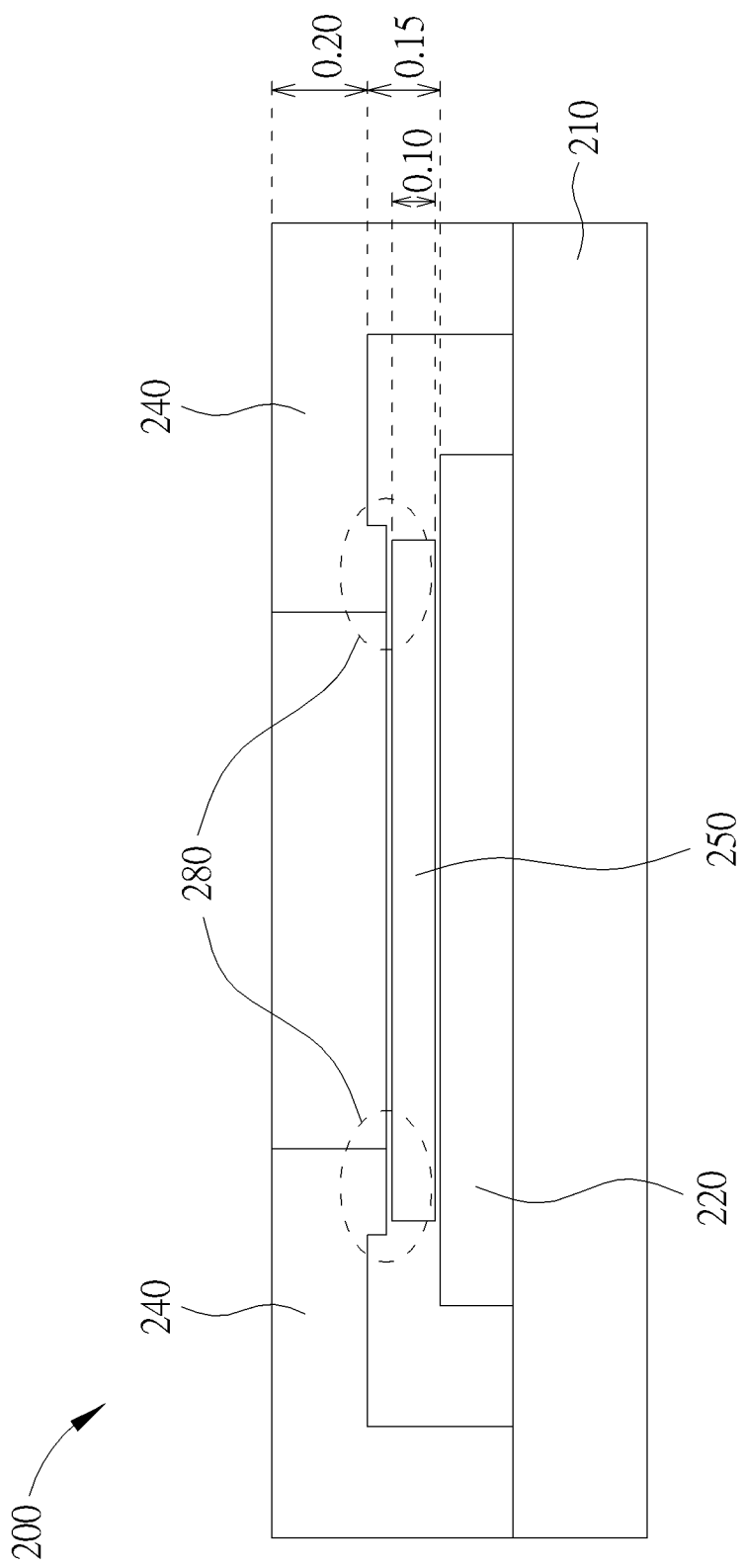
FIG. 3B is a cross-sectional diagram of the optical sensor package shown in FIG. 3A.

Refer to FIG. 3B which is a cross-sectional diagram of the optical sensor package 200 taken along line B-B' as shown in FIG. 3A. The cross-sectional diagram shown in FIG. 3B includes various dimensions. As shown in the diagram, the roof of the aperture 240 has two thicker sections, indicated by the dashed lines and the numeral 280, which contact the glass cover 250. As in the related art, the height of the glass cover 250 is 0.10 mm. The distance between the top of the sensor die 220 and the bottom of the thinner part of the aperture 240 is 0.15 mm. This allows sufficient space for the wire looping (not shown) needed to transmit signals from the sensor die 220. The height of the thinner part of the aperture 240 is 0.20 mm, as compared to 0.30 mm in the related art.

This reduced thickness of the aperture 240 means that it is less resistant to external forces. Any pressure therein could cause the ceiling of the aperture 240 to slant down which could contact and damage the wire looping below. This is why the aperture 240 includes the thicker sections 280. In addition, the area of the glass cover 250 is designed to be larger than the cut-out section of the aperture 240. In this way, the thicker sections 280 act as a 'hard stop' for the aperture 240. An added advantage is that the glass cover 250 is placed at a further distance from the Kapton tape 260 which reduces the possibility of any residue from the tape contaminating the glass. In addition, placing the glass cover 250 directly on the sensor die 220 can prevent any contamination to the active area, and also allows for easy cleaning.

In order to further strengthen the optical sensor package 200, the thickness of the PCB 210 can be increased with respect to the related art (to 0.4 mmm, for example), which will prevent any damage occurring to the glass cover 250 or the optical sensor package 200 due to any external force.

Figure 4A:
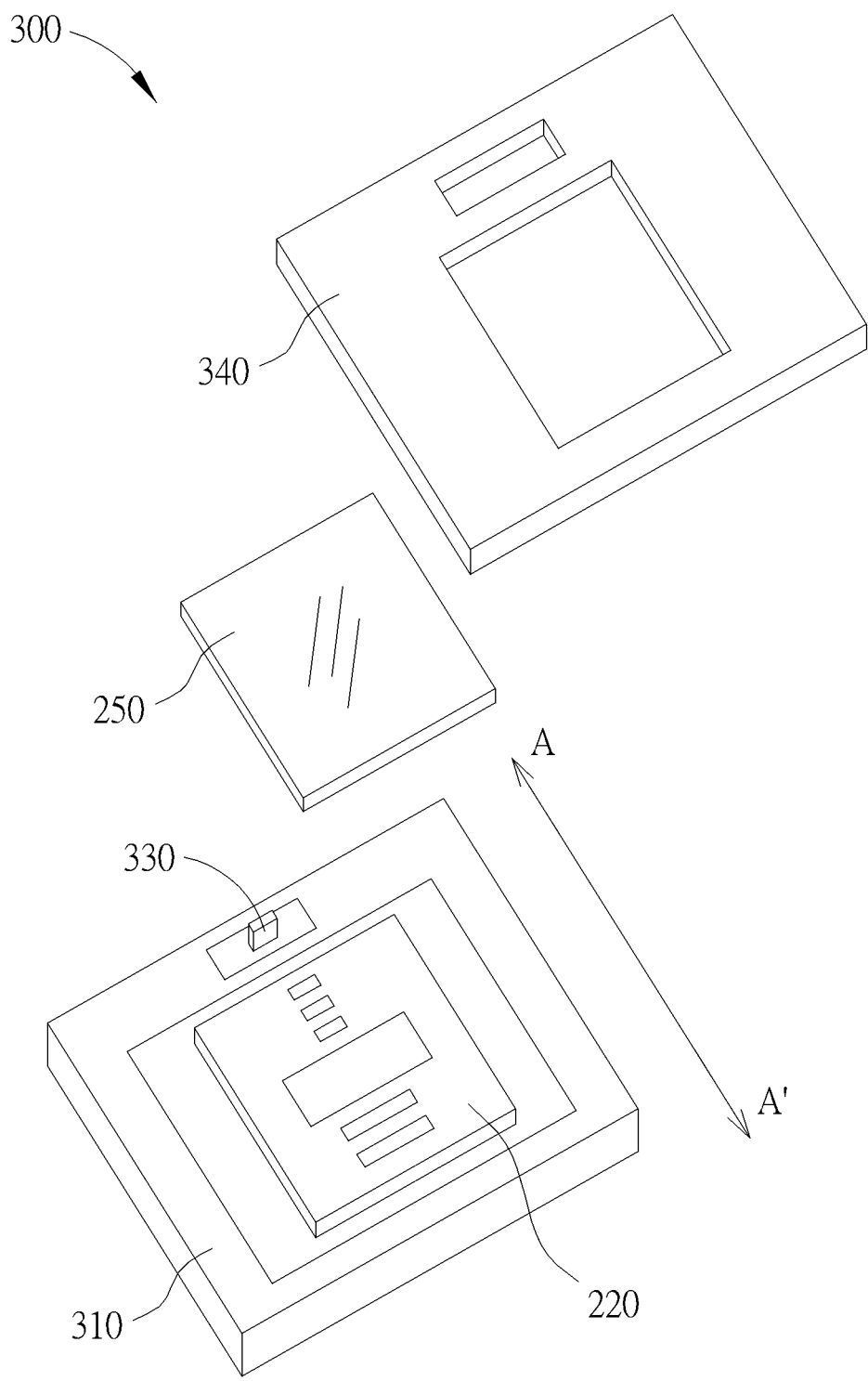
FIG. 4A is a diagram of the manufacturing stages of the optical sensor package according to another embodiment of the present invention.

It should be noted that the optical sensor package 200 shown in FIG. 3A and FIG. 3B does not comprise an LED. Refer to FIG. 4A, which is a diagram of the manufacturing stages of the optical sensor package 300 according to another embodiment of the present invention. As shown in the bottom of the diagram, a PCB 310 has a sensor die 220 and an LED die 330 formed thereon. Next, a glass cover 250 is placed directly on the sensor die 220. Finally, as shown in the top of the diagram, the aperture 340 having a first cut-out section in the roof for the LED die and a second cut-out section in the roof for the sensor die will be placed on the PCB 310.

Figure 4B:
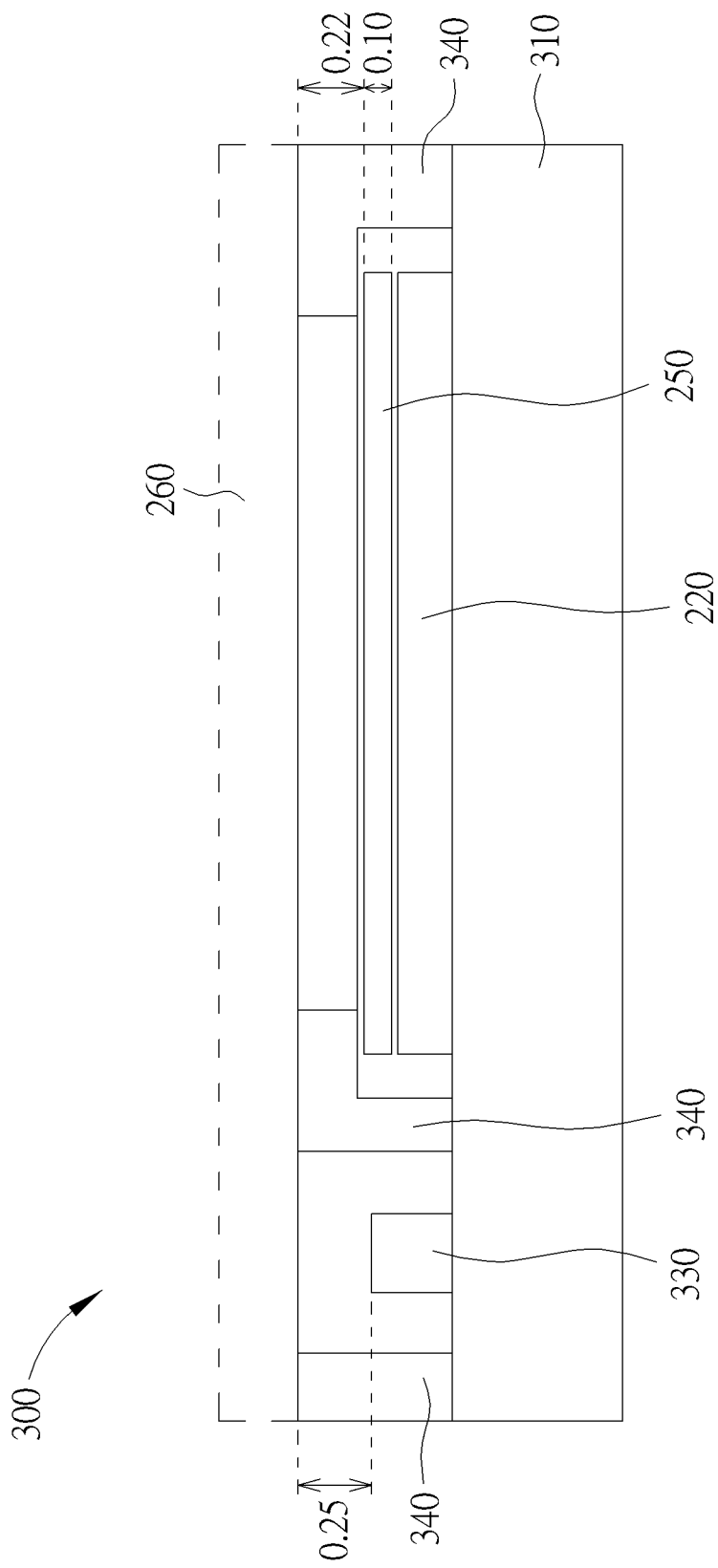
FIG. 4B is a cross-sectional diagram of the optical sensor package shown in FIG. 4A.

Refer to FIG. 4B which is a cross-sectional diagram of the optical sensor package 300 taken along line A-A' as shown in FIG. 4A. The cross-sectional diagram shown in FIG. 4B includes various dimensions. As shown in the diagram, the roof of the aperture 340 from this angle has as uniform thickness of 0.22 mm. The distance between the top of the LED die 230 and the top of the aperture 340 is 0.25 mm.

Although the LED die 330 can be a same LED die as in the related art, due to the height of the aperture 340 being lower than in the related art, more light is able to exit the optical sensor package 300 and less of the beam from the LED die 330 will be clipped by the surrounding structure. In addition, the reduced height means the LED die 330 will be closer to its target, which allows for increased accuracy. Efficiency is further improved.

Figure 5:
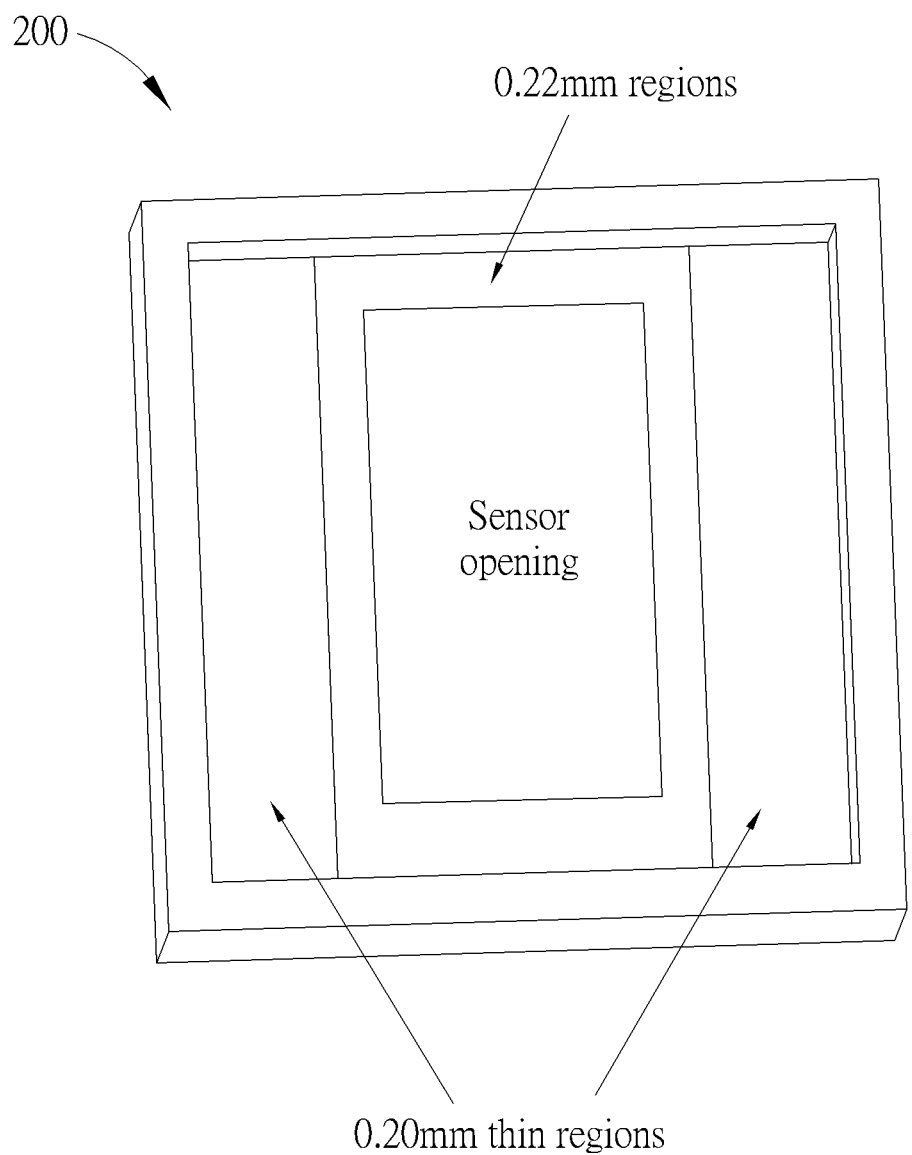
FIG. 5 is a top-view diagram of the optical sensor package shown in FIG. 2.

FIG. 5 illustrates a top view of the optical sensor package 200 shown in FIG. 2, illustrating the thickness of the aperture 240 in two directions. As shown in the diagram, the part of the aperture 240 around the sensor opening has a thickness of 0.22 mm. The two sections on either side of the sensor opening have a thickness of 0.20 mm.

It should be noted that the glass cover 250 should be larger in area than the cut-out section of the aperture ceiling; however, the glass cover 250 cannot be greater than the overall size of the PCB 210/310, as this will cause issues when attaching the aperture 240/340, and will also be subject to damage if there are protruding edges beyond the surface of the PCB 210/310.

In terms of manufacturing stages, the only difference with respect to the related art is that the glass cover should be attached before the aperture, as the glass cover sits under the aperture in the present invention, rather than on top. The size of the cut-out section of the aperture ceiling will be according to the size of the active area of the sensor die, but should also be designed so as to be smaller in area than the glass cover.

The optical sensor package of the present invention has a reduced thickness with respect to the related art. This enables the sensor die to be placed closer to a target, which increases the efficiency and further allows for increased illumination when the optical sensor package comprises an LED die. In addition, by placing the glass cover underneath the aperture ceiling, there is an increased distance between the glass and Kapton tape, which prevents any contamination or residue being left on the glass.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reduced thickness optical sensor package, comprising:
    a printed circuit board (PCB);
    a sensor disposed on the PCB;
    a glass cover disposed directly on the sensor; and
    an aperture disposed on the PCB comprised of a solid perimeter surrounding the sensor and a ceiling having a cut-out section above the glass cover;
    wherein the thickness of the aperture ceiling is 0.20 mm.

2. The optical sensor package of claim 1, wherein the cut-out section of the ceiling is smaller in area than the glass cover so that part of the ceiling overhangs the glass cover.

3. The optical sensor package of claim 2, wherein the part of the aperture ceiling which overhangs the glass cover has a thickness of 0.22 mm.

4. The optical sensor package of claim 1, further comprising an LED die disposed on the PCB, wherein the aperture ceiling has another cut-out section above the LED die.

5. The optical sensor package of claim 1, wherein the PCB has a thickness of 0.4 mm.

6. The optical sensor package of claim 1, further comprising Kapton tape placed over the ceiling of the aperture.

7. The optical sensor package of claim 1, being a Land Grid Array (LGA) optical sensor package.

* * * * *